(12) United States Patent
Freeman et al.

(10) Patent No.: US 6,937,176 B2
(45) Date of Patent: Aug. 30, 2005

(54) ULTRASONIC SIGNAL ACQUISITION IN THE DIGITAL BEAMFORMER

(75) Inventors: Steven R. Freeman, Seattle, WA (US); Gary Allen Schwartz, Seattle, WA (US); Raf Lodewijk Jan Roovers, Wommelgem (BE); Lucien Johannes Breems, Eindhoven (NL); George Anthony Brock-Fisher, Andover, MA (US); Theodore Philip Fazioli, Salem, NH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/950,760

(22) Filed: Sep. 27, 2004

(65) Prior Publication Data

US 2005/0068221 A1 Mar. 31, 2005

Related U.S. Application Data

(60) Provisional application No. 60/507,155, filed on Sep. 30, 2003.

(51) Int. Cl.[7] .............................................. H03M 3/00
(52) U.S. Cl. ..................................... 341/143; 341/155
(58) Field of Search ................................. 341/118, 120, 341/142, 143, 155–172

(56) References Cited

U.S. PATENT DOCUMENTS 5,654,711 A * 8/1997 Fujimori ..................... 341/143
5,833,613 A    11/1998 Averkiou et al.
5,879,303 A     3/1999 Averkiou et al.
5,982,313 A * 11/1999 Brooks et al. ............... 341/143
6,232,901 B1 *  5/2001 Abbey ........................ 341/143
6,313,775 B1 * 11/2001 Lindfors et al. ............. 341/143
6,452,524 B1 *  9/2002 Fraleigh et al. ............. 341/143
6,516,667 B1    2/2003 Broad et al.
6,567,025 B2 *  5/2003 Schreier et al. ............. 341/143
6,867,718 B2 *  3/2005 Cesura et al. ................ 341/118

OTHER PUBLICATIONS

"How Ultrasound System Considerations Influence Front–End Component Choice", by E. Brunner, Analog Dialogue 36–03 (2002), pp. 1–4, no month.

"A Low Power Digital Beamformer for Handheld Ultrasound Systems", by V.S. Gierenz et al, University of Technology RWTH, Aachen, Germany, pp. 1–4, no date.

* cited by examiner

*Primary Examiner*—Michael Tokar
*Assistant Examiner*—Linh V. Nguyen

(57) ABSTRACT

A receive beamformer, and ultrasound system incorporating such a receive beamformer, is constructed to implement multi-bit analog to digital conversion in such a way that the need for gain control in the channel architecture preceding the digital conversion circuitry is obviated. Accordingly, the beamformer and any ultrasound system incorporating it may realize a rigorous level of ADC performance at desirable output rates, and a lower cost. Preferably, the invention construction realizes a level of performance by which CW Doppler may be digitized in the same manner as very wide-band pulsed-wave signals.

11 Claims, 4 Drawing Sheets ic SIGNAL ACQUISITION IN
ULTRASONIC SIGNAL ACQUISITION IN THE DIGITAL BEAMFORMER

CROSS REFERENCE TO RELATED CASES

Applicants claim the benefit of Provisional Application Ser. No. 60/507,155, filed Sep. 30, 2003.

This invention relates to ultrasonic diagnostic imaging systems and, in particular, to ultrasonic diagnostic imaging systems, which may be improved by implementation of high-speed and/or high dynamic range A/D converters disposed within the digital beamformer.

FIG. 1 shows a simplified diagram of a conventional ultrasound system 10. Therein is shown a transducer array 12 electrically connected to a high voltage multiplexer/demultiplexer (Mux/Demux) 14 through a cable 16. The Mux/Demux is electrically connected to both transmit/receive (T/R) switches 18 and an output port of a high voltage (HV) amplifier 20, an input port of which is connected to transmit beamformer 22. The transmit beamformer determines the delay pattern and pulse train that sets the desired transmit focal point. The HV amplifier amplifies the outputs of the transmit beamformer to drive the transducers of transducer array 12. The HV amplifier may be controlled by digital-to-analog converters (DACs, not shown in FIG. 1) to shape the transmit pulses to optimize delivery to the transducer elements.

The T/R switches 18 are part of the receive side, and typically comprise a diode bridge (not shown) to block the high transmit voltage pulses, followed by low noise amplifiers (LNAs) 24 and variable gain amplifier (VGA) 26. Together, the LNAs and VGA implement time gain control (TGC) for maintaining image uniformity. The VGA output is provided to the receive beamformer 28 (B and F mode). The receive beamformer and transmit beamformer 22 are controlled by beamformer central control system 30. On the receive side, after amplification by the VGA, beamforming is performed in analog (ABF) or digital (DBF). Most beamforming occurs digitally, but for continuous wave (CW) Doppler operation, the dynamic range requirements for continuous wave Doppler are simply too large to pass through the same channel as the image.

Hence, the output of LNA 24 is also provided to a CW (analog) beamformer 34, the output of which is processed in spectral Doppler processing unit 36 (D mode). Doppler processed output is provided an audio transducer 38 and display 40. B-mode creates gray scale images; F-mode is a color overlay on b-mode that highlights blood flow and D-mode is the Doppler display that might show blood flow velocities and their directions. Receive beamformer output is provided to image and motion processor 42 (B-mode) and color Doppler processor 44 (F-mode), the outputs of which are provided to the display 40.

As previously mentioned, convention CW (analog) beamforming uses a separate analog data path that includes mixers, summers, integrators and a very high resolution ADC. The dynamic range requirements of this CW data path are quite rigid and demanding due to the fact that the data path must accommodate the largest signals including near-transducer reflections superimposed on very weak blood-related signals at-depth. Very low noise and large signal handling capability are needed simultaneously of the front-end circuitry. Every channel within the beamformer must support approximately 160–170 dB of dynamic range over a 1 Hz bandwidth. For a 200 kHz bandwidth, which is typically utilized in conventional CW beamformers, the dynamic range requirement per channel is on the order of 110–120 dB.

FIGS. 2A and 2B show basic block diagrams of an analog beamformer (ABF) 50 and digital beamformer (DBF) 70, respectively. Analog beamformer 50 shows energy-transmitted to/from a focal point 52 from transducer array 54. The output of each element comprising array 54 is connected to VGAs 56, which amplify the analog signals driving each element. The amplified (or attenuated) analog signals are output from the VGAs and delayed in variable delay lines 58. The delayed analog outputs are manipulated in analog adder 60, and converted to digital in ADC 62. Digital beamformer 70 shows energy transmitted to/from a focal point 72 from transducer array 74. The output of each element comprising array 74 is connected to VGAs 76, which amplify (attenuate) the signals before they arrive at the ADCs. ADC 78 generates the digital signals, which are provided to FIFOs 80 (or other digital buffer), the outputs of which are then provided to digital adder 82.

The front-end circuitry, mainly the noise floor of the low noise amplifier (LNA) 24, determines the smallest signal, which may be effectively received and processed by an ultrasound system. And as mentioned, in Doppler processing, the LNA needs to also handle very large signals, increasing the need for dynamic range. CW Doppler has the largest dynamic range needs of all ultrasound processing because it requires transmission of a sinusoid continuously with half the transducer array while receiving on the other half. Typically, there is leakage across the transmit/receive path, as well as strong reflections coming from stationary objects close to the transducer arrays. Hence, CW Doppler (analog) signals cannot be processed through main imaging (B-mode) and PW Doppler (F-mode) path in a DBF system. Ultrasound systems, therefore, to process Doppler must have a separate channel for CW Doppler. Put another way, there are no ADCs currently available with sufficient dynamic range to simultaneously handle the largest and smallest echo signals exiting the transducer array. The current state of the art high speed, high resolution ADC's (for example, Analog Devices' AD6644 14b/65MSPS ADC) having a SNR of 74 dB, but still are unable to provide enough SNR at 14 bits to do the job. Moreover, all the devices in the channel, including whatever drives the ADC must have the same SNR. Eberhard Brunner, ULTRASOUND SYSTEM CONSIDERATIONS AND THEIR IMPACT ON FRONT-END COMPONENTS, Analog Devices, Inc. (2002).

The beamformer provides for the coherent summation of individual energy signals from each of the transducer elements forming the array. The beamformer controls the delays on every element to synthesize a receive beam into the field of view. These delays are dynamically adjusted as a function of range to maintain an in-foci beam as the transmitted pulse propagates. The image quality relies on the focusing process and the correct amount of delay applied to signals from each transducer element. To keep image quality high, delays must be adjustable in steps that are much smaller than a wavelength of the ultrasound propagating in the tissue ($1/16^{th}$ of a wavelength is generally considered sufficient). Gierenz, et al., A LOW POWER DIGITAL BEAMFORMER FOR HANDHELD ULTRASOUND SYSTEMS, University of Technology RWTH, Aachen, Germany (2002). The critical design requirements of the beamformer are to preserve the entire bandwidth, which contains all the acoustic information, without distortion of the tissue signature during the delay process, and to provide accurate delay for focusing and steering.

While FIG. 2B merely shows a VGA 76 between the transducer array and ADCs 78, most digital beamformers include means to low pass filter the signals before passing them to the ADC. The analog filter attenuates high frequency noise and out-of-band signals (to prevent aliasing). ADCs may take on such forms as flash converters for high conversion rates, successive approximation converters for moderate conversion rates and ramp converters for high resolution. Over-sampling converters use simple and high tolerance analog components for implementation, but require fast, complex DSP stages. Sigma-delta converters use noise shaping techniques and over-sampling to allow for high-resolution conversion of relatively low bandwidth signals. The sigma-delta converter typically includes the anti-aliasing filter, which now operates at the oversampling rate, eliminating the need for a separate analog filter. This applies as well to sigma-delta modulators, which include a continuous-time filter in the sigma-delta loop, where the signal is sampled after filtering. Discrete-time sigma-delta (switched-capacitor) modulators have a sampler at the input and do not provide anti-aliasing filtering.

The dynamic range, speed and SNR of the ADC are critical to overall DBF operation in ultrasound imaging systems. Sigma-delta analog-to-digital converters (ADCs or sigma-delta converters) use high sample rates and filtering to reshape quantization noise so that the quantization noise does not contaminate signals in the passband of interest. Base-band sigma-delta ADCs utilize very high-speed conversions to improve quantization noise ratios for narrow-band signals near DC. Such ADCs very accurately digitize near-DC signals because the very high oversampling ratios force more and more quantization noise out of the narrow band of the DC signal. The sigma-delta converter is inherently an oversampling converter, although oversampling is just one of the techniques contributing to the overall performance.

Basically, a sigma-delta converter digitizes an analog signal with a very low resolution (1 bit) at a very high sampling rate. By using oversampling techniques in conjunction with noise shaping and digital filtering, the effective resolution is increased. Decimation may then be used to reduce the effective sampling rate at the A/D converter (ADC) output. The sigma-delta ADC exhibits excellent differential and integral linearity due to the linearity of the 1 bit quantizer and DAC. The reader should note that multi-bit quantizers and DACs may also be used within the sigma-delta architecture but must be carefully designed to optimize linearity. Cascaded sigma-delta converters are particularly advantageous for high bandwidth A/D conversion as they provide high resolution at relatively low oversampling ratios.

In the spectrum of a periodically sampled waveform, the spectrum of the under-sampled input signal repeats around harmonics of the sampling frequency. Any frequency contained in the input signal is repeated above and below each harmonic of the sampling frequency. Therefore, in the spectrum of the sampled signal, the band between 0 and $f_{in}$, may appear between $f_s-f_{in}$ and $f_s+f_{in}$, where $f_s$ is the sampling frequency. So if, for example, the input is 100 kHz, if the sampling frequency is 1 M samples/sec, an input signal at 991 kHz appears as a 9 kHz "alias" component in the sampled signal's spectrum. Anti-aliasing filters are implemented to remove or at least attenuate any noise or spurious signals that could be aliased back into the bandwidth of interest. In over-sampling, the sampling frequency is much higher than the highest signal frequency. The selection of anti-aliasing filter cutoff frequency is based on the oversampling frequency, which reduces anti-aliasing filter roll-off requirements.

Oversampling also reduces ADC noise within the input signal bandwidth because it spreads quantization noise over a wider bandwidth. The quantization noise falling between $f_s/2$ and $kf_s/2$ is removed from the output by a digital filter, where k is the oversampling ratio and $f_s$ is the Nyquist frequency. This increases the overall signal to noise ratio (SNR) by $10 \log_{10}(k)$. This relationship is valid for uniformly distributed quantization noise (i.e., a flat noise spectrum). If the quantization noise is shaped, as is the case with sigma-delta converters, the relation no longer applies.

In order to maintain the oversampling ratio in reasonable bounds, it is possible to shape the frequency spectrum of the quantization noise in order that its majority lies between $f_s/2$ and $kfs/2$, where only a small portion is left between dc and $f_s/2$. This is accomplished by a sigma-delta modulator in a sigma-delta ADC. After the modulator shapes the noise spectrum, the digital filter can remove the bulk of the quantization noise energy, dramatically increasing the SNR. Accordingly, sigma-delta converters offer greater dynamic range, for example, by doubling the sampling frequency, a 9 dB improvement in SNR is realized (for a first order modulator).

The first part of a sigma-delta ADC is the modulator, which converts the input signal into a continuous stream of 1's and 0's at the sampling clock rate $kf_s$ (in the case of a 1-bit quantizer). The serial output data stream drives a one (1) bit digital-analog converter (DAC), and the DAC output is subtracted from the input signal. For any given input value in a single sampling interval, the data from a 1-bit ADC is difficult to interpret; however, when a large number of samples are averaged, a meaningful result is realized. The sigma-delta ADC may also be viewed as a voltage to frequency converter followed by a counter. If the number of ones in the output data stream is counted over a sufficient number of samples, the counter output will represent the digital value of the input.

After the quantization noise is shaped by the modulator and pushed into frequencies above the band of interest, the noise is digitally filtered. The digital filter acts as an anti-aliasing filter with respect to the final sampling rate $f_s$, and filters out the higher frequency noise. The final data rate reduction is performed by digitally re-sampling the filtered output using decimation, which reduces redundant signal information introduced by oversampling. ANALOG DEVICES (1993), Applications Reference Manual. But the bandwidth limitation of the sigma-delta converter requires expensive circuitry to exist in the receiver front end to vary the gain before the ADC. As discussed above with respect to the multi-bit ADC, the 1-bit baseband sigma-delta converter just does not have enough dynamic range to be connected directly to the transducer elements for acquisition of ultrasound signals. Hence, VGAs or like variable gain means must be included in each channel of a conventional ultrasound front end to scale the received signal into the ADC operating dynamic range. An example of such variable gain circuitry is a time gain compensation (TGC) circuitry (those skilled in the art will note that TGC circuitry is not used in CW mode).

TGC circuits are well known in the art and in general act to apply ever-increasing gain to the received echoes as echoes are received from ever-greater depths of the body. The TGC is required to vary or attenuate the gain of the received echoes to offset the effects of depth dependent attenuation over time because of the limitation of the dynamic range of the ADCs. Circuitry required to vary receiver gain in addition to CW Doppler circuitry imposes significant manufacturing costs in ultrasound systems (cost per channel). Total system channel counts are limited because of cost per channel, so any reduction in receiver circuitry could result in lower system cost or an increase in channel count at the same cost.

In addition to the inherent cost required to accommodate the large dynamic range for CW Doppler, the requirements for tissue harmonic imaging (THI) also impose rigid requirements because of the range between fundamental and harmonic signal strength at the receiver input. In THI, acoustic signals are propagated into the body at a fundamental frequency $f_0$. Non-linear (finite amplitude) distortion occurs in the body, where the resulting echoes from the distortion products are received along with echoes from the original transmit signal. The second harmonic, or $2f_0$, is desired for processing and display. Because the distortion products are typically at least 20 dB lower than the received energy at $f_0$, THI mode increases the dynamic range requirements for the conversion process considerably. THI is described in U.S. Pat. Nos. 5,833,613 (Averkiou et al.) and 5,879,303 (Averkiou et al.), incorporated herein by reference in their entireties.

In both contrast and tissue-harmonic imaging, it is necessary to distinguish or separate the harmonic signal components from the accompanying fundamental frequency components. Efforts to effect this separation have focused on filtering techniques such as band-pass filtering, and signal processing techniques such as the multiple echo technique known as pulse inversion. However, all of these techniques can be impeded by limitations in signal acquisition, the apparatus and processing used to initially acquire the harmonic signals. One such limitation is inherent in the use of digital beamforming, which is in widespread use in virtually all of today's premium ultrasound systems. The initial step in digital beamforming is the digital sampling of received echo signals by analog to digital conversion. Since the harmonic components are many dB down from fundamental signal component amplitudes, particularly in the case of tissue harmonic signals, much of the dynamic range of the digital echo samples will be occupied by fundamental signal information.

The fundamental signal components can even be of a strength which overwhelms or saturates the analog to digital converter. This renders the harmonic components undetectable in subsequent harmonic discrimination or separation processing. Saturation will generate odd harmonics, which can fall at even harmonic frequencies of interest, particularly troublesome in broadband imaging systems. U.S. Pat. No. 6,516,667, commonly owned and incorporated herein by reference, teaches a method and system which prevents such saturation and inability to detect the harmonic signal components, and to use a significant portion of the dynamic range of the analog to digital converter for conversion of the harmonic signal components. The inventions herein do so by selectively attenuating fundamental frequency components of an echo signal prior to digitization of the echo signal. As already mentioned, the need for the variable gain stage before the digital conversion increases cost per channel.

It is therefore an object of the present invention to provide a process and construction in a receive beamformer, and ultrasound system incorporating same, in which multi-bit analog to digital conversion may be implemented in such a way that the need for gain control in the channel architecture preceding the digital conversion means is obviated. Accordingly, the beamformer and any ultrasound system incorporating it may realize a rigorous level of ADC performance at desirable output rates, and a lower cost. Preferably, the invention construction realizes a level of performance by which CW Doppler may be digitized in the same manner as very wide-band pulsed-wave signals.

More particularly, one of the embodiments of the present invention provides that analog-to-digital conversion in which a desired 110–120 dB dynamic range over a 200 kHz bandwidth on every channel of the beamformer (to digitize the received CW signals) is implemented in an affordable manner. The result is a much wider dynamic range conversion in the ADCs normally included in each channel (which may be described as legacy hardware). More particularly, a sigma-delta ADC is included to digitize both very high fidelity narrowband CW signals as well as wide-band pulsed-wave imaging signals. The invention obviates the need for including switchable high-pass analog filters ahead of the converters to remove strong fundamental signal components from the received echoes, a separate analog CW path, and time gain control. The result is a decrease in per channel cost per system. Variable gain control pre-conversion is thereby obviated.

In another embodiment, a sigma-delta ADC with selectable bandwidths is used to digitize the receive signals in each channel of an ultrasound beamformer. The embodiment requires that one operating band of the sigma-delta ADC be very wide band for digitizing signal content in a range above 10 MHz, and include a much narrower operating bandwidth for those signals in a range below 10 MHz. Variable gain control pre-conversion is thereby obviated.

In a variation on the aforementioned embodiment, a pair of sigma-delta ADCs with a common input and selectable output is used. A first ADC is used for digitizing signals of interest with content above 10 MHz, and a second sigma-delta converter is included to digitize intermediate bandwidths below 10 MHz. The result is beamformer channel design with improved quantization noise performance with essentially conventional architecture, and over-sampling ratio of the very wide bandwidth described. The lower range ADC would be relied upon as the "workhorse" ADC for most imaging probes for use in digitizing signal (or signal content) below 10 MHz. A beneficial result is the design ability to omit the very high bandwidth ADC for midrange or low-end systems that would not benefit from high-frequency transducers. Variable gain control pre-conversion is thereby obviated.

In another embodiment of this invention, a receive beamformer is disclosed which includes a very wide bit-width ADC for each channel with a large enough dynamic range to eliminate the variable gain amplifier stage for each channel, as well as the need for separate CW circuitry.

In another embodiment of the invention, a basic sigma-delta architecture is modified by adding a compensating analog delay line, and a fast single bit loop to realize a creative solution to the need for dynamic range and enable the implementation of lower end ADCs with conventional latencies of several clock cycles but nevertheless operating with SNR performance of base-band sigma-delta converters. In practice, the inventive delta-sigma converter provides that CW and very wide-band pulsed wave signal inputs are routed to a conventional ADC, which may have significant conversion latency common to low-end converters. The digital output from each channel's ADC is added to a one-bit signal and fed to a digital-to-analog converter (DAC). The channel input signal is also routed to the analog delay line, which delay line is specified to provide a delay that is equivalent to the ADC latency, as well as any delay inherent in the DAC. The signal which passes through the ADC and DAC is subtracted in a differential amplifier from that signal which passes through the delay line. The signal resulting from the subtraction is integrated in an integrator and quantized with a fast one bit converter. The output of the one bit converter provides the digital signal that is summed with the common ADC output word.

In a variation of the described embodiment, each channel of an ultrasound system is constructed to make use of a DAC from the transmit channel which is idle during receive to increase the range of the ADC process. The inventive architecture requires that a differential amplifier and analog integrator are inserted in the receive chain. During receive operation, the analog output of the DAC (within the transmitter circuitry) is coupled to the differential amplifier. The digital input of the DAC is driven by a signal that is either directly received from the ADC, or derived in some other way from it. Any method of implementing the signal derived from it other than from the ADC is available from those skilled in the art without changing the scope or spirit set forth in this embodiment. The reader will note that such construction resembles that of a first-order sigma-delta modulator, and the embodiment makes use of the similarities by operating the architecture to increase the dynamic range of the ADC and reduce the need for sophisticated analog amplifiers and filters on a per channel basis.

And yet another embodiment of the invention is a sigma-delta modulator, which is designed to operate using legacy components inherent in each channel of an ultrasound system to realize superior digital beam summing, as well as an ability to form multiple simultaneous receive beams. More particularly, the embodiment uses square wave mixers already present in each CW beamformer channel to mix the inputs to DC, and digitize the mixer outputs. This is accomplished using two sigma-delta ADCs in the transmit/receive beamformer, and therefore, with little extra cost in both money and space, realize all digital summation for both pulsed mode and CW operation.

The dynamic range of all the inventive processes and hardware set forth herein results in a dynamic range of greater than 60 dB, and preferably a dynamic range of greater than 70 dB, and most preferably where dynamic range is greater than 80 dB. While described predominantly as being implemented with a sigma-delta ADC, the present invention may be implemented with any multi-bit converter with which the invention may be implemented. However, the preferable ADC for implementation is the sigma-delta converter.

All of the above-described embodiments may be utilized in all imaging and Doppler mode of operation of an ultrasound system, passing the received signals through the same ADCs in the front end, with very little signal condition pre-conversion. Again, the gain in decreased costs of the obviated components realizes a lower cost for high-end systems (e.g., an increased channel count), or low-end systems.

The inventions, as specifically defined in the claims appended hereto, can be better understood with reference to the following drawings. The components within the drawings are not necessarily drawn to scale relative to each other, emphasis instead being placed upon clearly illustrating the principles of the invention.

The dynamic range of a beamformer channel used for ultrasound imaging may be increased dramatically using conventional sigma-delta ADCs when modified in accordance with the various embodiments of this invention. Stated another way, the various embodiments of this invention address the need for wide dynamic range (i.e., large SNR) and flexible conversion bandwidths needed in beamformers of ultrasound imaging systems.

Figure 1:
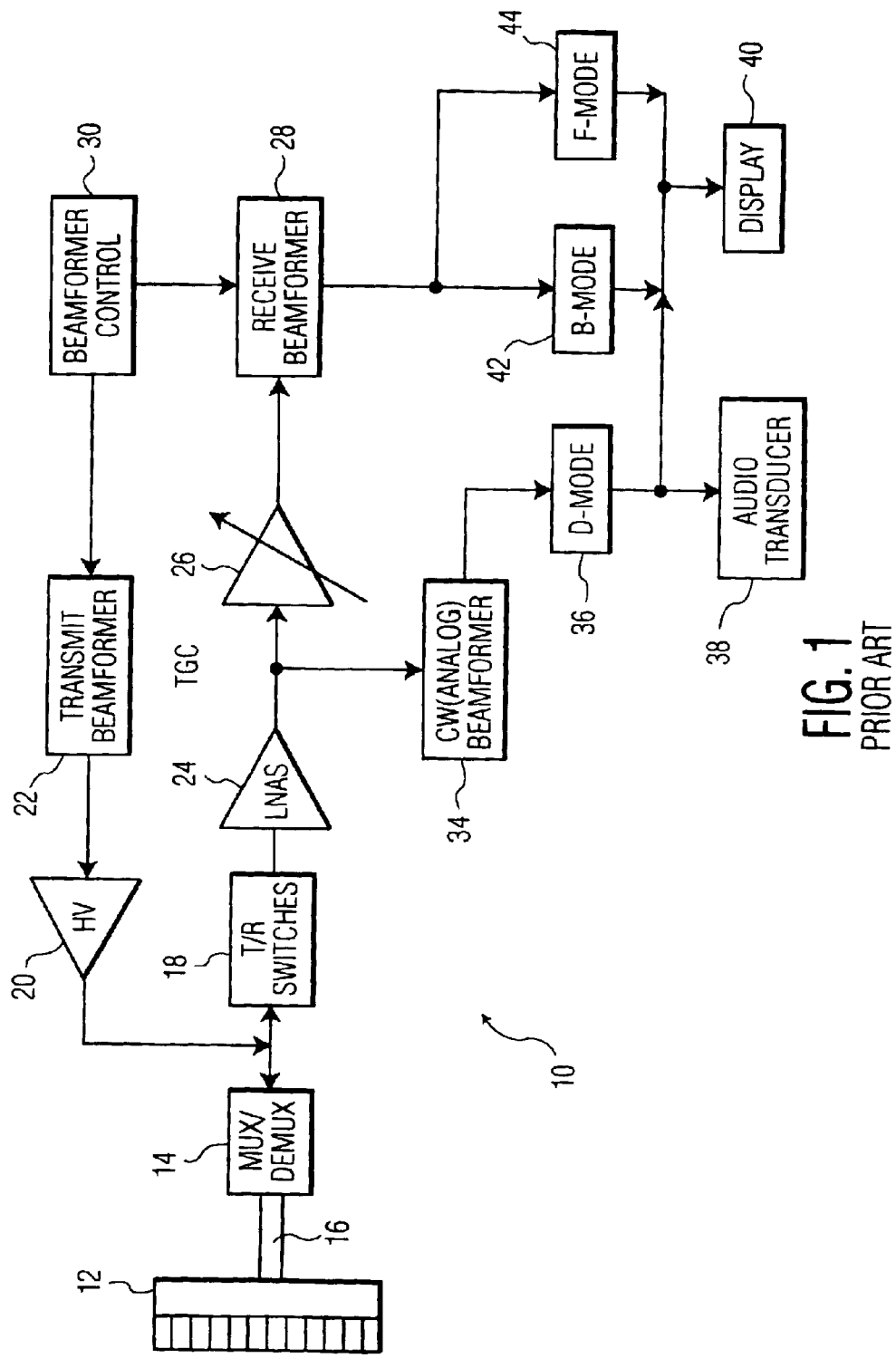
FIG. 1 is a diagram of a prior art ultrasound system for imaging CW Doppler and wide-band pulsed wave signals.
Figure 2A:
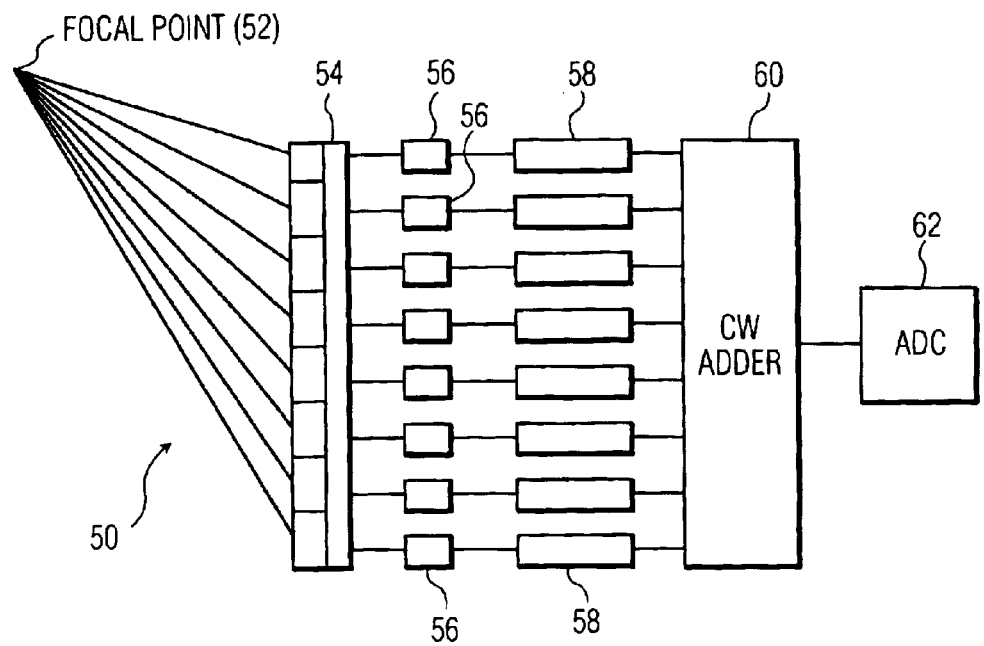
FIGS. 2A and 2B are schematic depictions of prior art analog and digital beamformer channels, respectively.
Figure 2B:
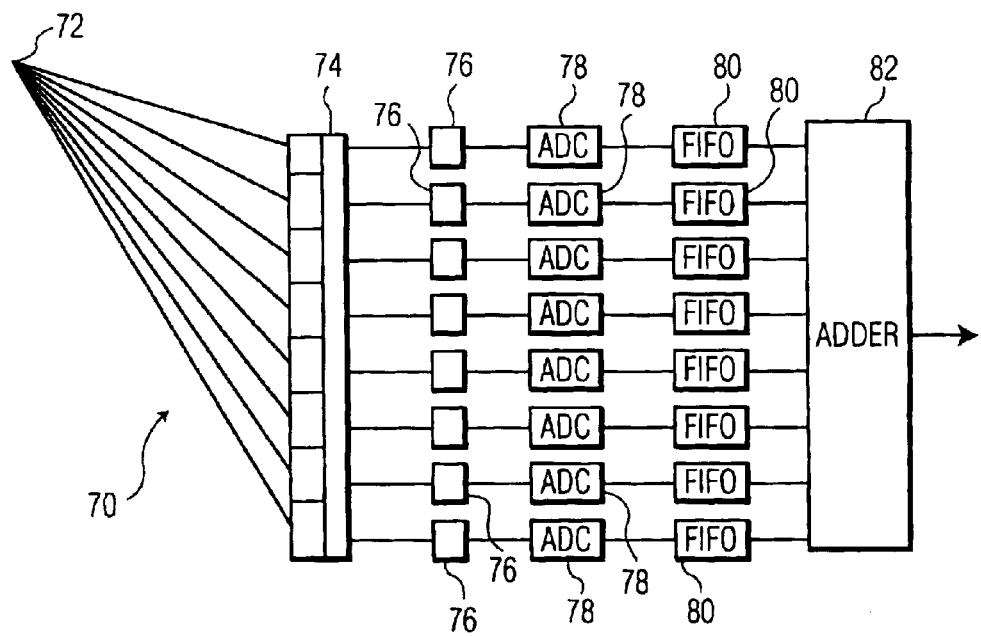
Figure 3:
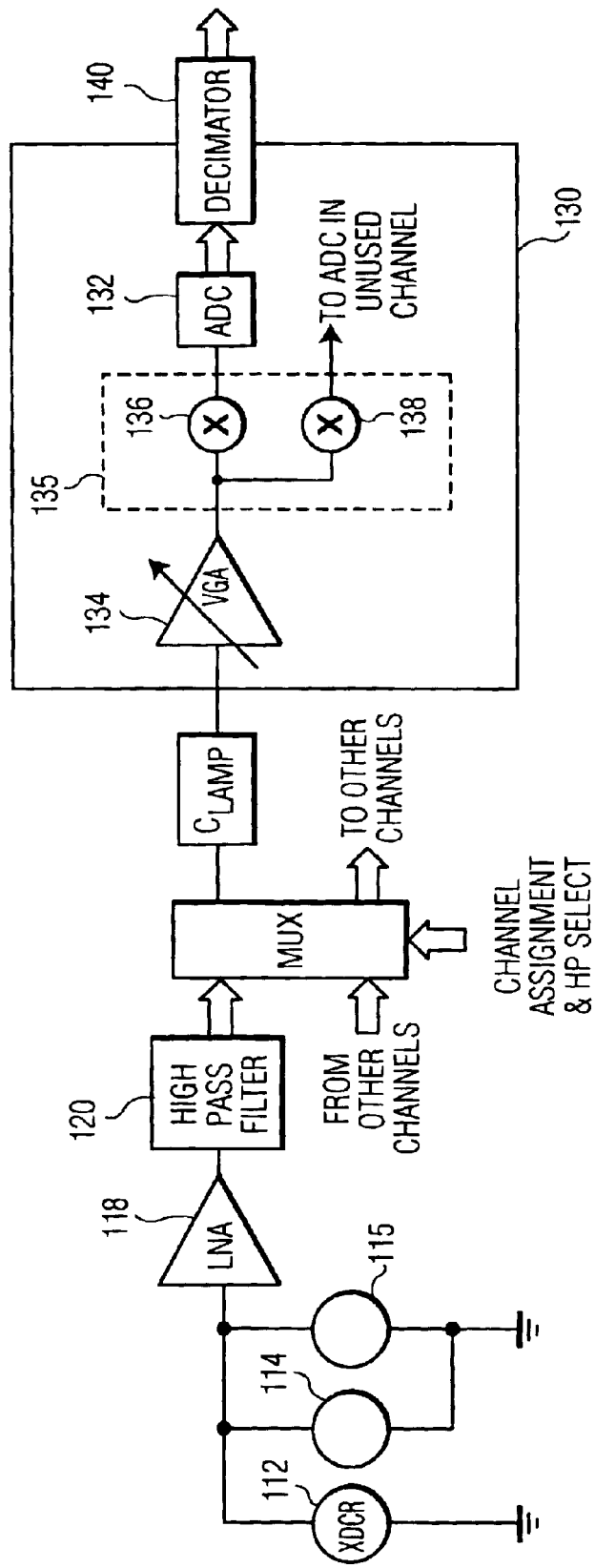
FIG. 3 is a schematic diagram of a first embodiment of the invention.

One embodiment of the present invention is represented by a beamformer channel 130 within front-end processing path 100 of one channel of an ultrasound imaging system, as depicted in FIG. 3A. Each channel of the beamformer includes a sigma-delta ADC 132 with a selectable bandwidth for digitizing very broadband signals and signal of intermediate bandwidth. One of the selectable bandwidths must be specified to convert the RF data from the higher frequency transducer elements, which deliver signals that are in excess of over 10 MHz, and display a very high bandwidth. The other selectable range (or ranges) of the selectable bandwidth ADC must convert the signals within the intermediate bandwidths below 10 MHz. The other selectable range must, with the same architecture, be specified with a better noise quantization specification and greater over-sampling ratio than the upper range wide band portion. The use of this ADC in the beamformer obviates the need for variable gain control circuitry (e.g., TGC) required conventionally.

The front-end processing path 100 includes transmit receive crystal (XDCR) 112 and receive inputs 114 and 116 representing received CW Doppler and received very wideband pulsed-wave signals. The inputs are directed to a low noise amplifier (LNA) 118, an output of which is coupled into a high-pass analog filter 120. The output of the LNA is provided to an input port 122 of multiplexer 124. The multiplexer also receives inputs from other channels at port 123, and includes an output port 125 and channel assignment and HP select input 126. The multiplexer output at port 127 is coupled to clamping circuit 128. The output of the clamping circuit is provided to an input of a variable gain amplifier (VGA) 134 within beamformer 130. The amplified analog output is provided to I, Q inputs 136, 138 of mixer 135.

A variation of this embodiment is beamformer channel 110, which requires that the ADC 132 comprises at least two high order, band-pass sigma-delta ADCs. The at least two ADCs are arranged as a set which is activated in a multiplexed arrangement depending on the frequency range of the signal content for conversion. That is, the set arrangement comprising the ADCs has a common input and selectable output. The first ADC of the set (order is not material) is required (and specified) to digitize bandwidths above 10 MHz, and must be broadband for processing signals for the higher frequency transducer elements. The second ADC is specified for intermediate bandwidths below 10 MHz. The second ADC must display better quantization noise performance than the first, for the same architecture, and an over-sampling ratio that is better than that of the very wide-band first ADC structure described. By using the smaller bandwidth construction, the beamformer will show improved quantization and noise performance. Further, the lower range ADC would be relied upon as the "workhorse" ADC for most imaging probes for digitizing signals (or signal content) below 10 MHz. A beneficial result is the design ability to omit the very high bandwidth ADC for midrange or low-end systems that would not benefit from high-frequency transducers, and of course obviating a need for amplification (or attenuation) prior to digitization.

To capitalize on this, input signals may be mixed to DC using a square wave mixer. However, because such mixers are already present in the existing beamformer hardware in every channel, the operation described is realized with existing hardware. The I output is fed to the sigma-delta ADC 132, which is followed by decimator 140. The Q output is fed to an ADC of an unused channel, as will be described in greater detail below.

Sigma-delta ADCs typically display a very deep noise null at or near DC, and therefore provide a quality SNR for signal modulated to 200 KHz. Sigma-delta ADCs for digitizing +−10 MHz signals are typically band-pass sigma deltas. Accordingly, a base-band sigma-delta would be a third ADC per channel, i.e., not existing hardware. Alternatively, such baseband sigma-delta could be an IF high-order band pass sigma-delta with a very deep noise null at some IF frequency (rather than DC).

A variation on the present embodiment includes IF sigma-delta modulators (e.g., a sigma-delta modulator with an integrated analog mixer inside (or outside) the sigma-delta loop). However, those skilled in the art should note that the inventive embodiments described herein are for exemplary purposes only, and the scope of the invention as claimed should not be in any way limited to requiring a bandpass modulator. For that matter, two IF sigma-delta modulators are needed for I and Q demodulation to replace one bandpass ADC.

Conventional CW beamformers use approximately half the channels for transmit and half the channels for receive. Beamformer 130 is arranged such that ADC 132 is used for one mixer output and a second ADC (not shown in FIG. 3) is used from the transmit side during receive mode to digitize the other mixer output. Either mixer may be used with any ADC present in the beamformer without deviating from the scope of the invention contemplated herein. The phase of the square wave mixing signals may be set (as is conventional) according to the desired receive focus and steering. The digitized output may be adjusted in decimator 140 for later processing/use by the ultrasound system. The I and Q data channels are scaled and summed with other per-channel data just as it is done conventionally in broad-band beamformers. A significant difference with the embodiment described and conventional beamforming is that the summation between channels may now takes place digitally, and is therefore immune from noise injected by various board-to-board noise sources. The beamsum realized is superior in quality as compared to those generated by conventional beamformers, especially in the case where large numbers of elements are summed.

The signals from the I and Q data channels may be passed through two of four multi-beam outputs of the digital beamformer. The signals require further processing in the backend for filtering and FFT processing. The ability to uniquely weight the per-channel contribution to the CW beamsum is an important consequence of the inventive all-digital CW beamformer technique and construction. One skilled in the art may use creative methods for time multiplexing multiple CW foci to different positions in the image by adjusting different mixer phases on every channel. This may be accomplished by the digital beamformer, but is not limited thereto.

The above construction is able to provide for beamforming wherein multiple simultaneous receive beams are formed. To do so, the mixing signals define the phase of the first CW receive beam. Such mixing is equivalent at the carrier to a multiplication of the input RF signal by $e^{(jwt+\phi)}$, where w is the analog frequency ($2\pi f$) and $\phi$ is is the desired CW beamforming delay. The I and Q digital data streams represent the resulting sine and cosine components of the complex exponential multiplication. To apply a different CW delay for a second receive beam, and effective multiplication by $e^{(jwt+\gamma)}$ is necessary, where $\gamma$ is the desired delay for the second beam. Since the digital streams already include the jwt+$\phi$ term, only a multiplication by ($\gamma-\phi$) is required to derive the proper delay for the second beam. This is a time invariant signal and can easily be applied in the exemplary beamformer described herein, or any other beamformer known and used by those skilled in the art as a weighted sum of the digitized I and Q components from every channel into the output I and Q beamsum channels.

Multibeam CW receive operation may be used to interrogate a sample volume from several different sub-apertures (and angles) across the array similar to a vector Doppler technique. The different flow estimates from each of the sub apertures should provide a more accurate estimate for peak flow velocity because different Doppler projections are measurable independently. The resulting FFTs should be "cleaner" when the data are combined for the multiple receive beams. The mixing signals (square waves that shift the RF signal to DC) may now be common to all channels and the necessary phase rotation may be conducted in the digital domain by implementation of the inventive concept and structure described herein. The result is a much-simplified front-end geometry in which per-channel square-wave control logic is eliminated. The inventors herein anticipate that such design will facilitate integration of many channels on one chip.

The mixing signals are also used to shift the spectra of high frequency receive signals, for example, harmonic signals realized by non-linear propagation, to DC or some intermediate frequency (IF) which may be more readily and/or efficiently sampled by the inherently low-pass sigma-delta ADC. This implementation utilizes a concept set forth in U.S. Pat. No. 5,964,708 (incorporated by reference in its entirety herein), but for the fact that the beamforming is not being implemented on single bit data. In the present invention, an advantage is that higher frequency transducers are supportable using low pass ADCs simply by shifting the signal of interest into the ADC passband. Accordingly, half of the number of transducer elements can be sampled, however, because the I and Q data channels of the shifted signals require two beamformer channels. Relatively narrowband 40 MHz probes, or applications that can trade bandwidth for SNR such as color Doppler, for example therefore, could be supported by such a system. A beam-former in which the true time delay capabilities could be used in combination with phase rotations for non-CW (but mixed to baseband) imaging modes signals are readily realizable. PW Doppler performance on high frequency probes is also enhanced by the inventive technique due to the improved S/N ratio realized hereby.

In another embodiment of the invention, a receiver and beamformer is disclosed which includes a very wide bit-width ADC for each channel with a large enough dynamic range to eliminate the variable gain amplifier stage for each channel, the separate CW circuitry, and analog harmonic filters for Tissue and Contrast Harmonic imaging. The embodiment may be utilized in all imaging and Doppler modes of operation of an ultrasound system, passing the received signals through the same ADCs in the front end, with very little signal conditioning pre-conversion. The simplified acquisition architecture without a VGA is desirable for lower cost low-end systems or to facilitate larger channel counts in high-end systems.

The signal path is simple. It is identical to the existing receiver designs, except that it eliminates the separate CW stage (mixers, etc.). Moreover, the ADC may be any type of converter, e.g., flash, sigma-delta, as long as the converter has the required speed and dynamic range. All imaging and Doppler modes operate through this signal path. Since the analog mixers are no longer used, the mixing and channel summing are done digitally in the beamformer function.

Figure 4:
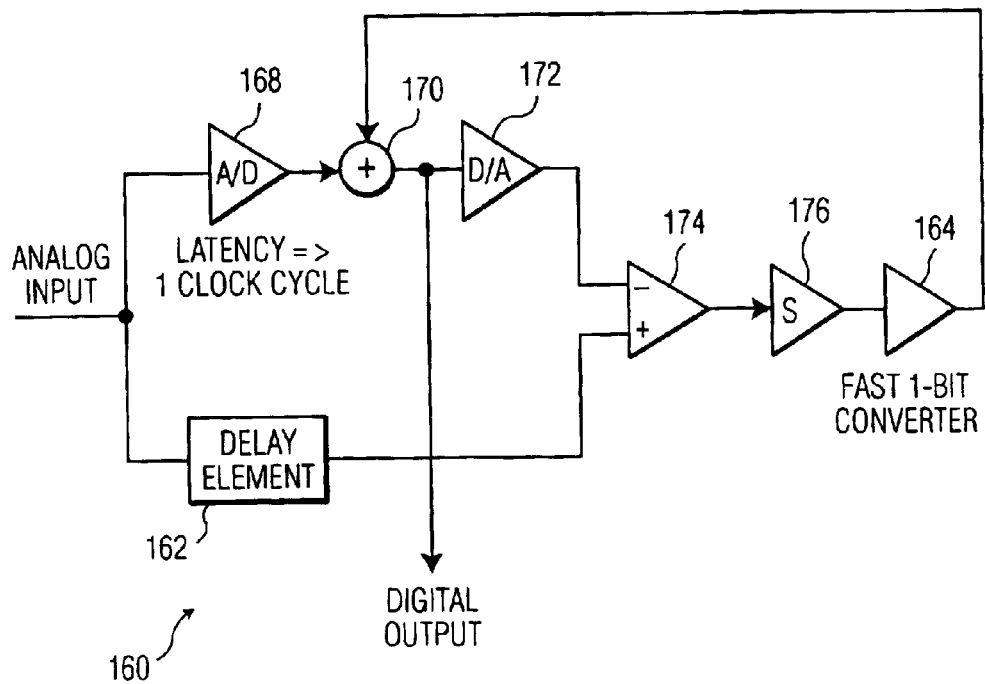
FIG. 4 is a schematic diagram of another embodiment of the invention.

In another embodiment of the invention, a basic sigma-delta architecture is modified to the inventive converter circuit 160, as shown in FIG. 4. The modification includes adding a compensating analog delay element 162, and a fast single bit quantizer 164 to form an additional loop as shown. Converter circuit 160 includes a multi-bit converter 168, wherein analog input is provided to both ADC 168 and delay element 162. An analog filter (not shown in FIG. 4) may be included, and the multi-bit converter 168 may have a significant conversion latency of low-end converters.

The analog signal delayed in delay element 162 is provided to the non-negative input port of a differencing amplifier 174. The digital output from the multi-bit converter is added in adder 170 with the signal output from the fast single-bit quantizer 164 (to be described). The adder output provides a digitized output word (converted input). The digital output word is also converted to analog in DAC 172. It is the analog equivalent of the digital output word which is provided to the negative input port of differencing amplifier 174. The output from the differencing amplifier is integrated in the integrator 176 and quantized with the fast one bit converter 164. The output of the one bit converter provides the digital signal which is summed with the ADC output word in adder 170. The summed signal represents the digital signal of the modified converter architecture of this embodiment.

The digital output may be digitally filtered in the same manner as the oversampled output from a conventional sigma-delta ADC. The result of filtering is an appropriately sampled representation of the analog input signal, with improved signal to noise ratio. It should be noted that there are at least three sources of noise in the conversion architecture embodiment. A first is the quantization noise of the multi-bit ADC, a second is the noise resulting from the fast one-bit converter and a third is noise from the analog delay line, noise emanating from which may or may not be shaped.

As both noise sources are differentiated in this architecture, the noise shaping characteristics of the sigma-delta converter are maintained. It follows that the S/N advantage realized by the sigma-delta technique may also be maintained after proper filtering of the digital output. By matching the two noise sources, a minimum degradation of 3 dB in S/N ratio may be maintained, as compared to the S/N ratio of a theoretical first-order multi-bit sigma-delta converter with a conversion latency of only one clock cycle.

Figure 5:
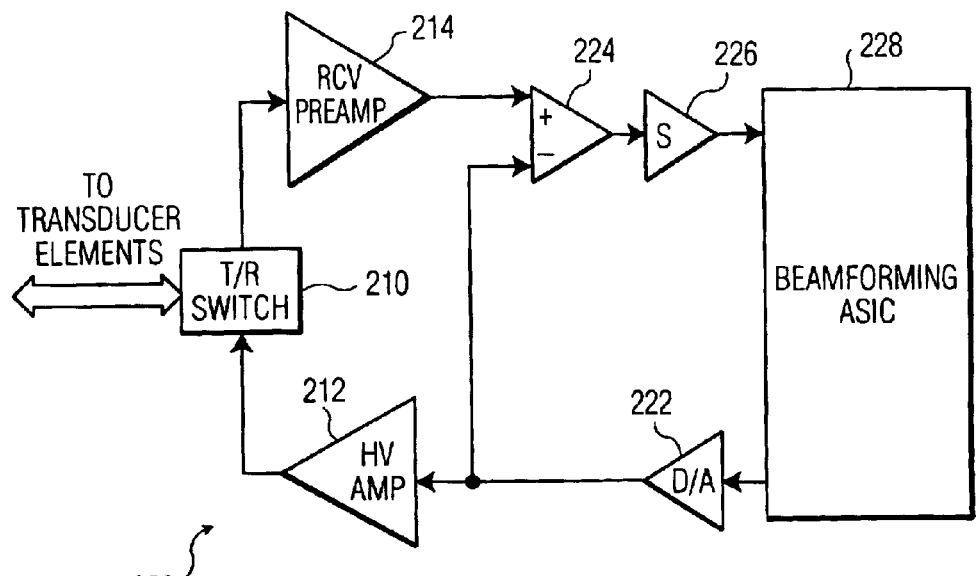
FIG. 5 is a schematic diagram of anther embodiment of the invention.

Another embodiment of the invention is depicted in FIG. 5. FIG. 5 shows a beamformer channel 220 for use in an ultrasound front end 200 which makes use of a DAC 222 from the transmit portion of channel 220, which is idle during receive. The embodiment increases the range of the ADC process. More particularly, the transducer elements (not shown explicitly in FIG. 5) are electrically coupled to T/R switch 210, which is itself electrically coupled to the output of high voltage amplifier 212 on the transmit portion of the receiver 214. The embodiment includes a differential amplifier 224 and analog integrator 226 inserted in the receive chain. During receive operation, the analog output from DAC 222 is coupled to the inverting input of the differential amplifier 224. The differenced output is integrated in integrator 226 and converted in ADC 228. The digital input to the DAC is driven by a signal that is either directly received from ADC 228, or derived in some other way from it, for example, through beamforming ASIC 228. The DAC output drives the transducers (via HV amp 212), and the DAC 224. Any method of implementing the signal derived from it other than from the ADC is available from those skilled in the art without changing the scope or spirit set forth in this embodiment.

FIG. 5 readily shows that that the circuitry described resembles a first-order sigma-delta modulator, and this embodiment makes use of the similarities by operating the architecture as would be a sigma-delta modulator to increase the dynamic range of the ADC and reduce the need for sophisticated analog amplifiers and filters on a per channel basis. The differential amplifier and integrator are trivial design-wise in view of this design, as compared with filters and variable gain stages in conventional arts. The oversampling provided by the sigma-delta design, and increased dynamic range is key to this embodiment, and further results in obviating the subsample delay interpolation filters in the beamforming process.

It will be apparent to those skilled in the art that any modifications and variations may be made to the embodiments and/or examples presented above without departing substantially from the principles of the invention. For example, the present inventions may be used with any imaging systems, and have particular application in the field of ultrasound imaging, but is not limited to any one implementation. Any limitations read into the present inventions may be interpreted only in accordance with the scope of the claims appended hereto.

What is claimed is:

1. A first-order multi-bit delta-sigma converter with large dynamic range and noise-shaping ability, comprising:
   a multi-bit A/D converter for converting a received analog signal;
   a digital adder electrically connected to the multi-bit A/D converter for receiving the analog signal and generating a converted digital output;
   a digital-to-analog converter electrically connected to the digital adder to convert a portion of the converted digital output to an analog signal;
   an analog delay element for delaying the received analog signal;
   differencing means for receiving the analog signal and the delayed analog signal, and subtracting the analog signal from the delayed analog signal and generating a differenced analog signal; and
   a fast one-bit loop comprising the differencing means, an integrator and a fast one-bit converter, wherein the differenced analog signal is integrated in the integrator and provided to fast one-bit converter, the output of which is fed back to the digital adder to generate the converted digital output.

2. The first-order multi-bit delta-sigma converter as set forth in claim 1, wherein the multi-bit A/D converter has significant conversion latency.

3. The first-order multi-bit delta-sigma converter as set forth in claim 1, further including a digital filter electrically connected to the digital adder output to maintain the noise-advantage of delta-sigma architecture.

4. The first-order multi-bit converter set forth in claim 1, wherein the fast one-bit loop operates at an integer multiple of a sampling rate of the digital-to-analog converter and the multi-bit A/D converter.

5. The first-order multi-bit converter set forth in claim 1, wherein the analog delay element is a switched capacitor device.

6. The first-order multi-bit converter set forth in claim 1, wherein the differencing means is a differential amplifier.

7. An ultrasound imaging system including a first-order multi-bit converter as set forth in claim 1.

8. An ultrasonic diagnostic imaging system comprising:
- a transducer array for receiving ultrasonic echo signals containing at least one of fundamental, harmonic and CW Doppler signal components;
- a transmit and receive beamformer, wherein the receive beamformer is coupled to receive echo signals generated by the transducer array, and wherein the receive beamformer includes a beamformer channel which comprises an analog-to-digital converter (ADC) for digitizing the echo signals therein; and
- a digital echo signal processor coupled to the receive beamformer channel to receive digitized echo signals converted in the ADC, wherein the ADC in the receive beamformer channel is a conventional multi-bit ADC, and further comprising a one-bit sigma-delta ADC, an analog delay line, an integrator, a differential amplifier and a digital-to-analog converter (DAC), and wherein a portion of the input signal digitized in the multi-bit ADC is converted to analog in the DAC and subtracted from a portion of the input signal delayed in the delay line by the differential amplifier, the difference signal integrated and converted in the one-bit sigma-delta ADC.

9. The ultrasonic imaging system of claim 8, wherein digital-to-analog non-linearity is compensated for.

10. The ultrasonic imaging system of claim 8, wherein the one-bit loop comprising the one-bit sigma-delta converter operates at an integer multiple of the sample rate of the multi-bit ADC and DAC.

11. The ultrasonic imaging system of claim 8, further including a differential amplifier and an analog integrator within the path of the receive beamformer, and a DAC in the transmit channel which is coupled to the differential amplifier and driven by a signal from the ADC to realize a first-order sigma delta modulator, wherein the modulator used in increase the dynamic range of the ADC.

* * * * *